US012648275B2

(12) United States Patent
Chen et al.

(10) Patent No.: US 12,648,275 B2
(45) Date of Patent: Jun. 2, 2026

(54) DISPLAY APPARATUS

(71) Applicant: AUO Corporation, Hsinchu (TW)

(72) Inventors: Peng-Yu Chen, Hsinchu (TW);
Chien-Chuan Chen, Hsinchu (TW);
Chih-Hung Tsai, Hsinchu (TW)

(73) Assignee: AUO Corporation, Hsinchu (TW)

( * ) Notice: Subject to any disclaimer, the term of this
patent is extended or adjusted under 35
U.S.C. 154(b) by 431 days.

(21) Appl. No.: 18/530,241

(22) Filed: Dec. 6, 2023

(65) Prior Publication Data

US 2024/0405167 A1 Dec. 5, 2024

(30) Foreign Application Priority Data

May 31, 2023 (TW) ................................. 112120286

(51) Int. Cl.
H10H 20/851 (2025.01)
H10H 20/857 (2025.01)
H10W 90/00 (2026.01)

(52) U.S. Cl.
CPC ...... H10H 20/8514 (2025.01); H10H 20/857
(2025.01); H10W 90/00 (2026.01)

(58) Field of Classification Search
CPC ........... H10H 20/8513; H10H 20/8514; H10H
20/8516; H10H 20/851; H10H 20/857
See application file for complete search history.

(56) References Cited

U.S. PATENT DOCUMENTS

| | | | |
|---|---|---|---|
| 9,680,070 B2 | 6/2017 | Zhao et al. | |
| 2020/0357781 A1* | 11/2020 | Onuma | H10W 90/00 |
| 2020/0381599 A1* | 12/2020 | Kuo | H10H 20/8514 |
| 2022/0231079 A1 | 7/2022 | Lee et al. | |

FOREIGN PATENT DOCUMENTS

| | | |
|---|---|---|
| CN | 104576625 | 4/2015 |
| CN | 110767669 | 2/2020 |
| CN | 111073629 | 4/2020 |
| CN | 114744006 | 7/2022 |
| CN | 115588401 | 1/2023 |

* cited by examiner

*Primary Examiner* — Marlon T Fletcher
*Assistant Examiner* — Samuel Jonathan Smith
(74) *Attorney, Agent, or Firm* — JCIPRNET

(57) ABSTRACT

A display apparatus includes a driving backplane, a first
bank layer, light-emitting elements, a second bank layer,
light adjusting patterns, a light-shielding pattern layer and
color filter patterns. The color filter patterns includes first
color filter patterns having the same color. The light-emitting
elements include first light-emitting elements respectively
overlapping the first color filter patterns. The light adjusting
patterns include first color conversion patterns respectively
overlapping the first color filter patterns. A center wave-
length of one of the first light-emitting elements is greater
than a center wavelength of another one of the first light-
emitting elements, and a thickness of one of the first color
conversion patterns is greater than a thickness of another one
of the first color conversion patterns.

8 Claims, 9 Drawing Sheets

DISPLAY APPARATUS

CROSS-REFERENCE TO RELATED APPLICATION

This application claims the priority benefit of Taiwan application serial no. 112120286, filed on May 31, 2023. The entirety of the above-mentioned patent application is hereby incorporated by reference herein and made a part of this specification.

BACKGROUND

Technical Field

The disclosure relates to an optoelectronic apparatus, and in particular to a display apparatus.

Related Art

With the evolution of display technology, display apparatuses with high resolution and thinness are favored by the mainstream market. In recent years, due to breakthroughs in the manufacturing process of light-emitting diode elements, Micro-LED displays or millimeter-scale light-emitting diode displays by arranging light-emitting diode elements in arrays have been developed. The Micro-LED displays do not require a liquid crystal layer, which can further reduce the thickness of the display apparatuses. Moreover, compared with organic light-emitting diode displays, the Micro-LED displays have the advantages of more power saving and longer life.

The Micro-LED display includes multiple micro light-emitting diodes and multiple color conversion patterns disposed on the multiple micro light-emitting diodes, wherein the color conversion pattern is used to convert a first color light emitted by the micro light emitting diode into a second color light, such that the Micro-LED display displays a color screen. Generally speaking, the center wavelengths of the multiple micro light-emitting diodes used to emit the first color light are not completely consistent. The same color conversion pattern has different conversion efficiencies for multiple first color lights having different center wavelengths, which leads to inconsistent brightness in multiple sub-pixel regions of the Micro-LED displays and poor optical performance.

SUMMARY

The disclosure provides a display apparatus with excellent optical performance.

The display apparatus of the disclosure includes a driving backplane, a first bank layer, multiple light-emitting elements, a first barrier layer, a second bank layer, multiple light adjusting patterns, a second barrier layer, a light-shielding pattern layer, and multiple color filter patterns. The driving backplane includes multiple sub-pixel driving structures. The first bank layer is disposed on the driving backplane and has multiple openings. The multiple light-emitting elements are disposed on the driving backplane, located in the multiple openings of the first bank layer, and are electrically connected to the multiple sub-pixel driving structures. The first barrier layer is disposed on the multiple light-emitting elements. The second bank layer is disposed on the first bank layer and has multiple openings. The multiple openings of the second bank layer respectively overlap the multiple openings of the first bank layer. The multiple light adjusting patterns are respectively disposed in the multiple openings of the second bank layer. The second barrier layer is disposed on the multiple light adjusting patterns. The light-shielding pattern layer is disposed on the second bank layer and has multiple openings. The multiple openings of the light-shielding pattern layer respectively overlap the multiple openings of the second bank layer. The multiple color filter patterns are disposed in the multiple openings of the light-shielding pattern layer. The multiple color filter patterns include multiple first color filter patterns having the same color. The multiple light-emitting elements include multiple first light-emitting elements respectively overlapping the multiple first color filter patterns. The multiple light adjusting patterns include multiple first color conversion patterns respectively overlapping the multiple first color filter patterns. One of the multiple first light-emitting elements and one of the multiple first color conversion patterns overlap one of the multiple first color filter patterns. Another one of the multiple first light-emitting elements and another one of the multiple first color conversion patterns overlap another one of the multiple first color filter patterns. A center wavelength of the one of the multiple first light-emitting elements is greater than a center wavelength of the another one of the multiple first light-emitting elements, and a thickness of the one of the multiple first color conversion patterns is greater than a thickness of the another one of the multiple first color conversion patterns.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
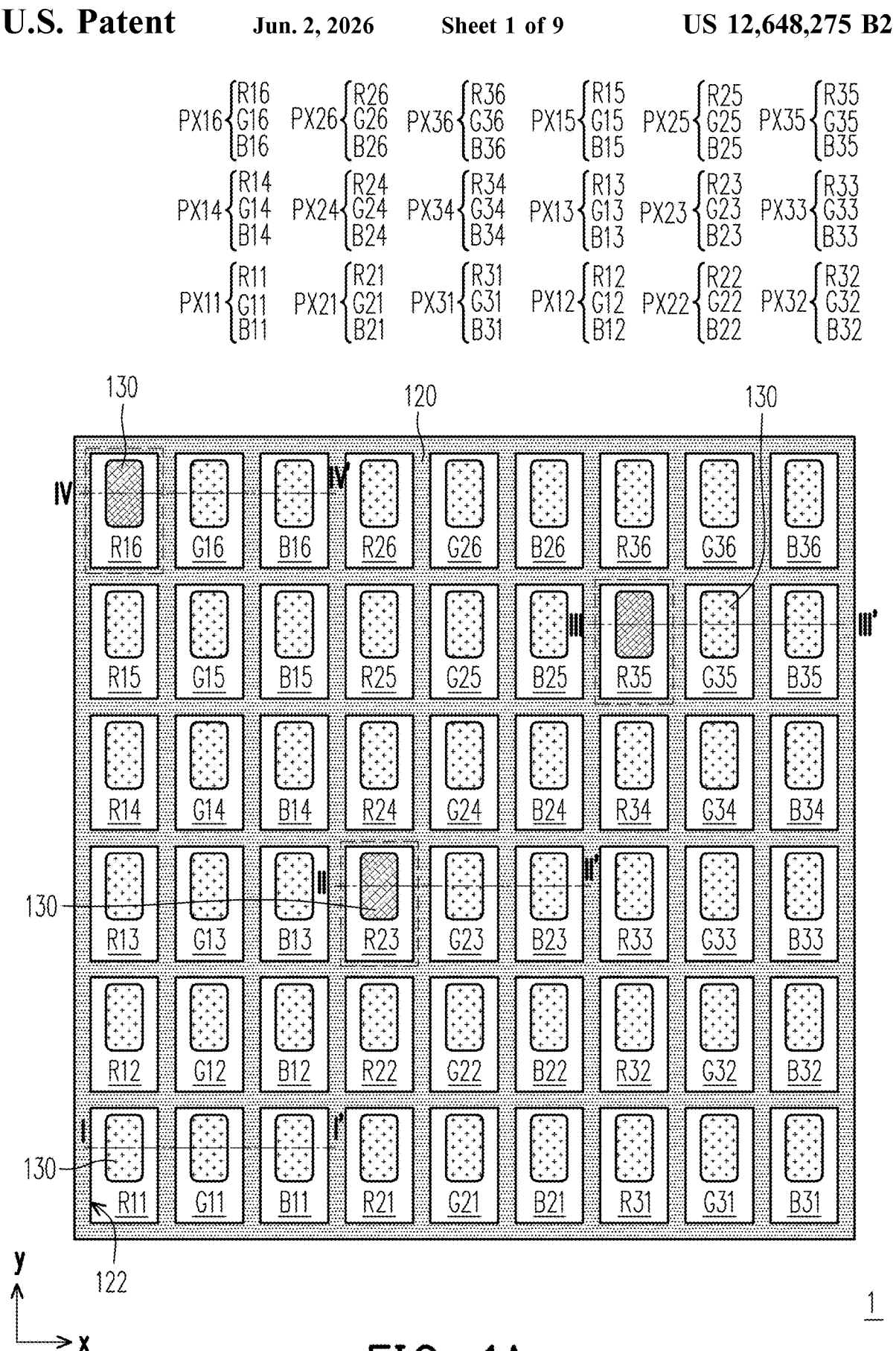
FIGS. 1A to 1D are schematic top views of the manufacturing process of a display apparatus according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

It will be understood that when an element such as a layer, film, region or substrate is referred to as being "on" or "connected to" another element, it may be directly on or connected to the other element, or intermediate elements may also be present. In contrast, when an element is referred to as being "directly on" or "directly connected to" another element, there are no intermediate elements present. As used herein, "connected" may refer to a physical and/or electrical connection. Furthermore, "electrical connection" or "coupling" may refer to the presence of other elements between two elements.

The terms "about", "approximately", or "substantially" as used herein includes the stated as well as the average value within an acceptable range of deviation from particular values as determined by those of ordinary skill in the art, taking into account the measurement in question and the specific amount of error associated with the measurement (i.e. limitations of the measurement system). For example, "about" may mean within one or more standard deviations of the stated value, or within ±30%, ±20%, ±10%, ±5%. Furthermore, for the terms "about", "approximately" or "substantially" used herein, a more acceptable deviation range or standard deviation may be applied based on optical properties, etching properties or other properties, and it is not necessary to apply one standard deviation to all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the relevant art and in the context of this disclosure, and not interpreted in an idealized or overly formal sense unless expressly so defined in the disclosure.

FIGS. 1A to 1D are schematic top views of the manufacturing process of a display apparatus according to an embodiment of the disclosure.

FIGS. 2A to 2D are schematic cross-sectional views of the manufacturing process of a display apparatus according to an embodiment of the disclosure. FIGS. 2A to 2D correspond to cross-section lines I-I' and II-II' of FIGS. 1A to 1D.

FIGS. 3A to 3D are schematic cross-sectional views of the manufacturing process of a display apparatus according to an embodiment of the disclosure. FIGS. 3A to 3D correspond to cross-section lines II-II', III-III', and IV-IV' of FIGS. 1A to 1D.

Figures 2A, 3A:
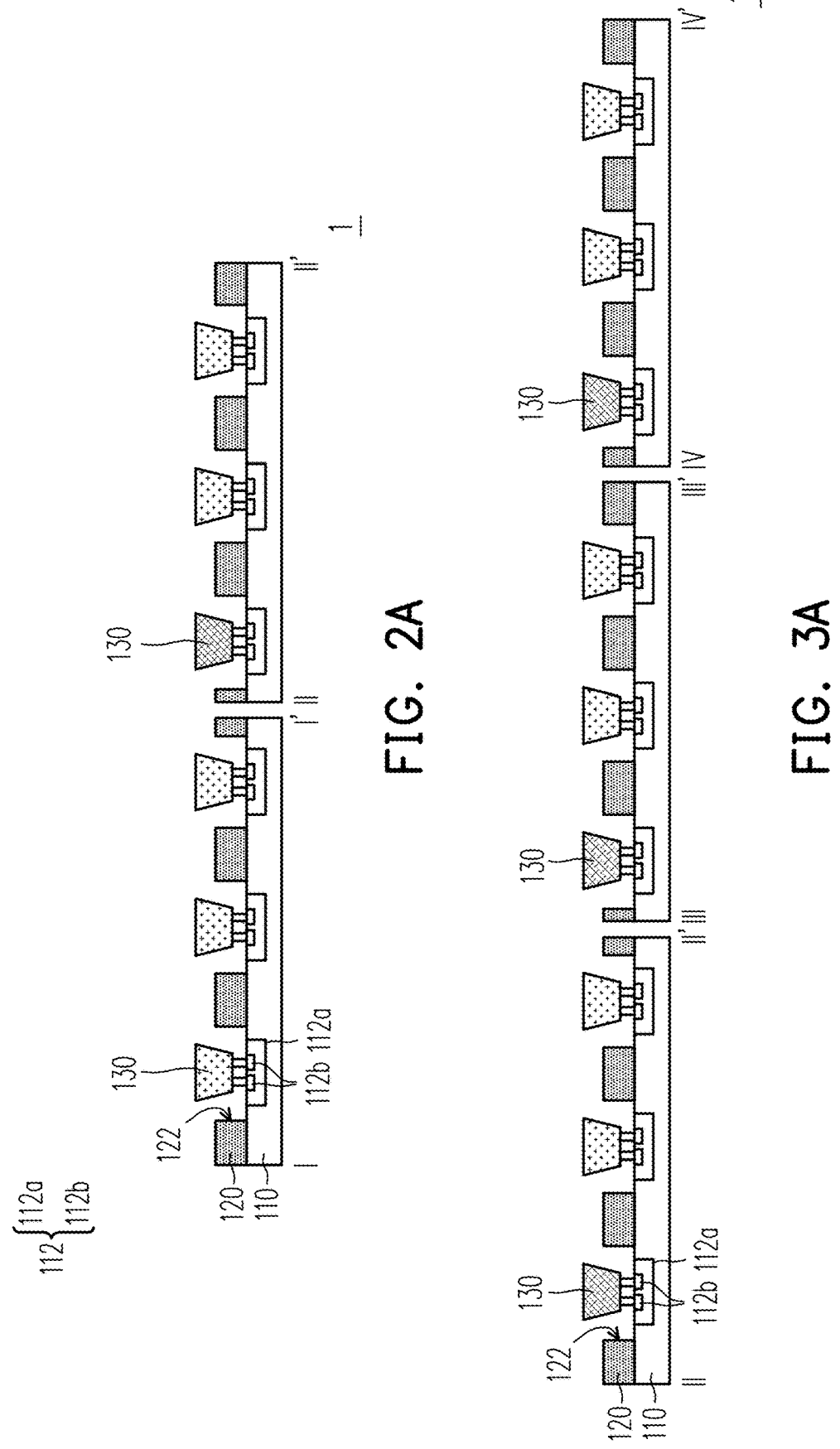
FIGS. 2A to 2D are schematic cross-sectional views of the manufacturing process of a display apparatus according to an embodiment of the disclosure.
FIGS. 3A to 3D are schematic cross-sectional views of the manufacturing process of a display apparatus according to an embodiment of the disclosure.

Please refer to FIG. 1A, FIG. 2A, and FIG. 3A. First, a driving backplane 110 is provided, which has multiple sub-pixel driving structures 112. In an embodiment, each of the sub-pixel driving structures 112 may include a sub-pixel driving circuit 112a and a pad set 112b electrically connected to the sub-pixel driving circuit 112a. For example, in an embodiment, the sub-pixel driving circuit 112a includes a first transistor (not shown), a second transistor (not shown), and a capacitor (not shown), wherein a first terminal of the first transistor is electrically connected to a corresponding data line (not shown), a control terminal of the first transistor is electrically connected to a corresponding scan line (not shown), a second terminal of the first transistor is electrically connected to a control terminal of the second transistor, a first terminal of the second transistor is electrically connected to a corresponding power line (not shown), the capacitor is electrically connected to the second terminal of the first transistor and the first terminal of the second transistor, a second terminal of the second transistor is electrically connected to a pad of the pad set 112b, and another pad of the pad set 112b is electrically connected to a corresponding common line (not shown). However, the disclosure is not limited thereto. In other embodiments, the sub-pixel driving circuit 112a may also be in other forms.

Next, a first bank layer 120 is formed on the driving backplane 110, wherein the first bank layer 120 has multiple openings 122. In an embodiment, the multiple openings 122 of the first bank layer 120 define multiple sub-pixel regions R11, G11, B11, R12, G12, B12, R13, G13, B13, R14, G14, B14, R15, G15, B15, R16, G16, B16, R21, G21, B21, R22, G22, B22, R23, G23, B23, R24, G24, B24, R25, G25, B25, R26, G26, B26, R31, G31, B31, R32, G32, B32, R33, G33, B33, R34, G34, B34, R35, G35, B35, R36, G36, B36 of the driving backplane 110.

In an embodiment, the multiple sub-pixel regions R11, G11, B11, R12, G12, B12, R13, G13, B13, R14, G14, B14, R15, G15, B15, R16, G16, B16, R21, G21, B21, R22, G22, B22, R23, G23, B23, R24, G24, B24, R25, G25, B25, R26, G26, B26, R31, G31, B31, R32, G32, B32, R33, G33, B33, R34, G34, B34, R35, G35, B35, R36, G36, B36 may be grouped into multiple pixel regions PX11, PX12, PX13, PX14, PX15, PX16, PX21, PX22, PX23, PX24, PX25, PX26, PX31, PX32, PX33, PX34, PX35, PX36. The pixel regions PX11; PX12; PX13; PX14; PX15; PX16; PX21; PX22; PX23; PX24; PX25; PX26; PX31; PX32; PX33; PX34; PX35; PX36 respectively have the multiple sub-pixel regions R11, G11, B11; R12, G12, B12; R13, G13, B13; R14, G14, B14; R15, G15, B15; R16, G16, B16; R21, G21, B21; R22, G22, B22; R23, G23, B23; R24, G24, B24; R25, G25, B25; R26, G26, B26; R31, G31, B31; R32, G32, B32; R33, G33, B33; R34, G34, B34; R35, G35, B35; R36, G36, B36. Multiple pad sets 112b are respectively disposed in the multiple sub-pixel regions R11, G11, B11, R12, G12, B12, R13, G13, B13, R14, G14, B14, R15, G15, B15, R16, G16, B16, R21, G21, B21, R22, G22, B22, R23, G23, B23, R24, G24, B24, R25, G25, B25, R26, G26, B26, R31, G31, B31, R32, G32, B32, R33, G33, B33, R34, G34, B34, R35, G35, B35, R36, G36, B36 of the multiple pixel regions PX11, PX12, PX13, PX14, PX15, PX16, PX21, PX22, PX23, PX24, PX25, PX26, PX31, PX32, PX33, PX34, PX35, PX36.

In this embodiment, the multiple sub-pixel regions R11, G11, B11; R12, G12, B12; R13, G13, B13; R14, G14, B14; R15, G15, B15; R16, G16, B16; R21, G21, B21; R22, G22, B22; R23, G23, B23; R24, G24, B24; R25, G25, B25; R26, G26, B26; R31, G31, B31; R32, G32, B32; R33, G33, B33; R34, G34, B34; R35, G35, B35; R36, G36, B36 of the pixel regions PX11; PX12; PX13; PX14; PX15; PX16; PX21; PX22; PX23; PX24; PX25; PX26; PX31; PX32; PX33; PX34; PX35; PX36 may respectively include first sub-pixel regions R11, R12, R13, R14, R15, R16, R21, R22, R23, R24, R25, R26, R31, R32, R33, R34, R35, R36; second sub-pixel regions G11, G12, G13, G14, G15, G16, G21, G22, G23, G24, G25, G26, G31, G32, G33, G34, G35, G36; and third sub-pixel regions B11, B12, B13, B14, B15, B16, B21, B22, B23, B24, B25, B26, B31, B32, B33, B34, B35, B36 that are to respectively display a first color, a second color, and a third color. In this embodiment, the first color, the second color, and the third color are, for example, red, green, and blue respectively, but the disclosure is not limited thereto.

Please refer to FIG. 1A, FIG. 2A and FIG. 3A. Next, multiple light-emitting elements 130 are arranged on the driving backplane 110, and the multiple light-emitting elements 130 are electrically connected to the multiple pad sets 112b. At this point, a bottom substrate 1 is completed. In an embodiment, the light-emitting elements 130 disposed in the first sub-pixel regions R11, R12, R13, R14, R15, R16, R21, R22, R23, R24, R25, R26, R31, R32, R33, R34, R35, R36 are used to emit blue light, for example. The light-emitting elements 130 disposed in the second sub-pixel regions G11, G12, G13, G14, G15, G16, G21, G22, G23, G24, G25, G26, G31, G32, G33, G34, G35, G36 are used to emit blue light, for example. The light-emitting elements 130 disposed in the third sub-pixel regions B11, B12, B13, B14, B15, B16, B21, B22, B23, B24, B25, B26, B31, B32, B33, B34, B35, B36 are used to emit blue light, for example. However, the disclosure is not limited thereto. In an embodiment, the light-emitting element 130 is, for example, a micro light-emitting diode (μLED), but the disclosure is not limited thereto.

Please refer to FIG. 1A, FIG. 2A and FIG. 3A. Next, the multiple light-emitting elements 130 are divided into multiple types according to the center wavelength of the light beams emitted by the multiple light-emitting elements 130, and positions of the various types of the light-emitting elements 130 are recorded.

A first direction x intersects with a second direction y. Multiple pixel regions PX11, PX12, PX13, PX14, PX15, PX16 are sequentially arranged along the second direction y to form a first column. Multiple pixel regions PX21, PX22, PX23, PX24, PX25, PX26 are sequentially arranged along the second direction y to form a second column. Multiple pixel regions PX31, PX32, PX33, PX34, PX35, PX36 are sequentially arranged along the second direction y to form a third column. Multiple pixel regions PX11, PX21, PX31 are sequentially arranged along the first direction x to form a first row. Multiple pixel regions PX12, PX22, PX32 are sequentially arranged along the first direction x to form a second row. Multiple pixel regions PX13, PX23, PX33 are sequentially arranged along the first direction x to form a third row. Multiple pixel regions PX14, PX24, PX34 are sequentially arranged along the first direction x to form a fourth row. Multiple pixel regions PX15, PX25, PX35 are sequentially arranged along the first direction x to form a fifth row. Multiple pixel regions PX16, PX26, PX36 are sequentially arranged along the first direction x to form a sixth row.

Taking the classification of the light-emitting elements 130 located in the first sub-pixel regions R11, R12, R13, R14, R15, R16, R21, R22, R23, R24, R25, R26, R31, R32, R33, R34, R35, R36 as an example, the center wavelengths of the light beams emitted by the light-emitting element 130 located in the first sub-pixel region R11 of the pixel region PX11 in the first column and the first row; the light-emitting element 130 located in the first sub-pixel region R21 of the pixel region PX21 in the second column and the first row; the light-emitting element 130 located in the first sub-pixel region R31 of the pixel region PX31 in the third column and the first row; the light-emitting element 130 located in the first sub-pixel region R12 of the pixel region PX12 in the first column and the second row; the light-emitting element 130 located in the first sub-pixel region R22 of the pixel region PX22 in the second column and the second row; the light-emitting element 130 located in the first sub-pixel region R32 of the pixel region PX32 in the third column and the second row; the light-emitting elements 130 located in the first sub-pixel region R13 of the pixel region PX13 in the first column and the third row; the light-emitting elements 130 located in the first sub-pixel region R33 of the pixel region PX33 in the third column and the third row; the light-emitting elements 130 located in the first sub-pixel region R14 of the pixel region PX14 in the first column and the fourth row; the light-emitting elements 130 located in the first sub-pixel region R24 of the pixel region PX24 in the second column and the fourth row; the light-emitting element 130 located in the first sub-pixel region R34 of the pixel region PX34 in the third column and the fourth row; the light-emitting element 130 located in the first sub-pixel region R15 of the pixel region PX15 in the first column and the fifth row; the light-emitting elements 130 located in the first sub-pixel region R25 of the pixel region PX25 in the second column and the fifth row; the light-emitting element 130 located in the first sub-pixel region R26 of the pixel region PX26 in the second column and the sixth row; and the light-emitting element 130 located in the first sub-pixel region R36 of the pixel region PX36 in the third column and the sixth row fall in a normal value (e.g. 455 nm), and are classified as a normal type. The center wavelengths of the light beams emitted by the light-emitting element 130 located in the first sub-pixel region R23 of the pixel region PX23 in the second column and the third row; the light-emitting element 130 located in the first sub-pixel region R35 of the pixel region PX35 in the third column and the fifth row; and the light-emitting element 130 located in the first sub-pixel region R16 of the pixel region PX16 in the first column and the sixth row deviate from the normal value and respectively fall in a first abnormal value (e.g. 452 nm), a second abnormal value (e.g. 450 nm), and a third abnormal value (e.g. 454 nm), and are respectively classified as a first abnormal type, a second abnormal type, and a third abnormal type.

Figure 1B:
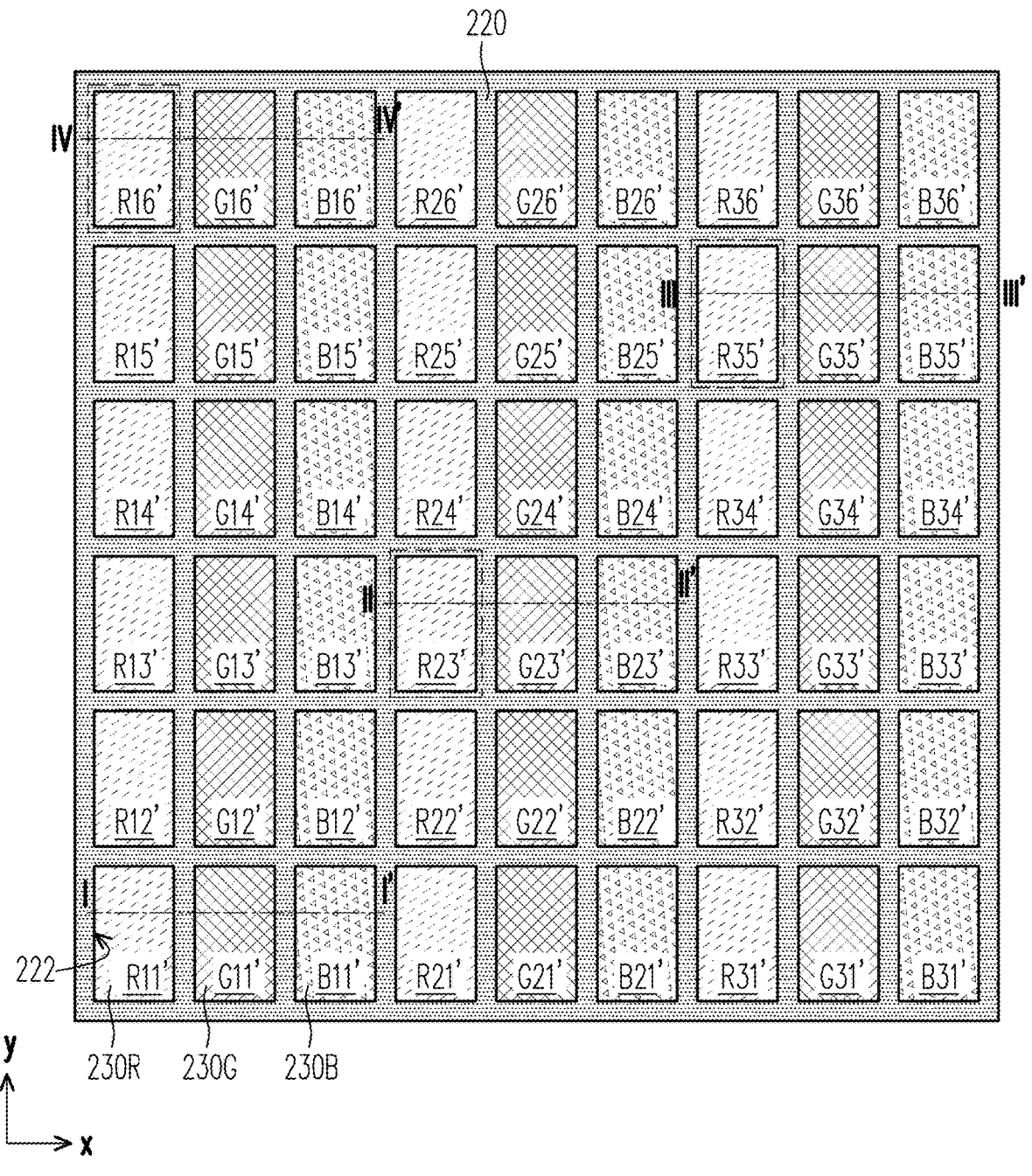
Figures 2B, 3B:
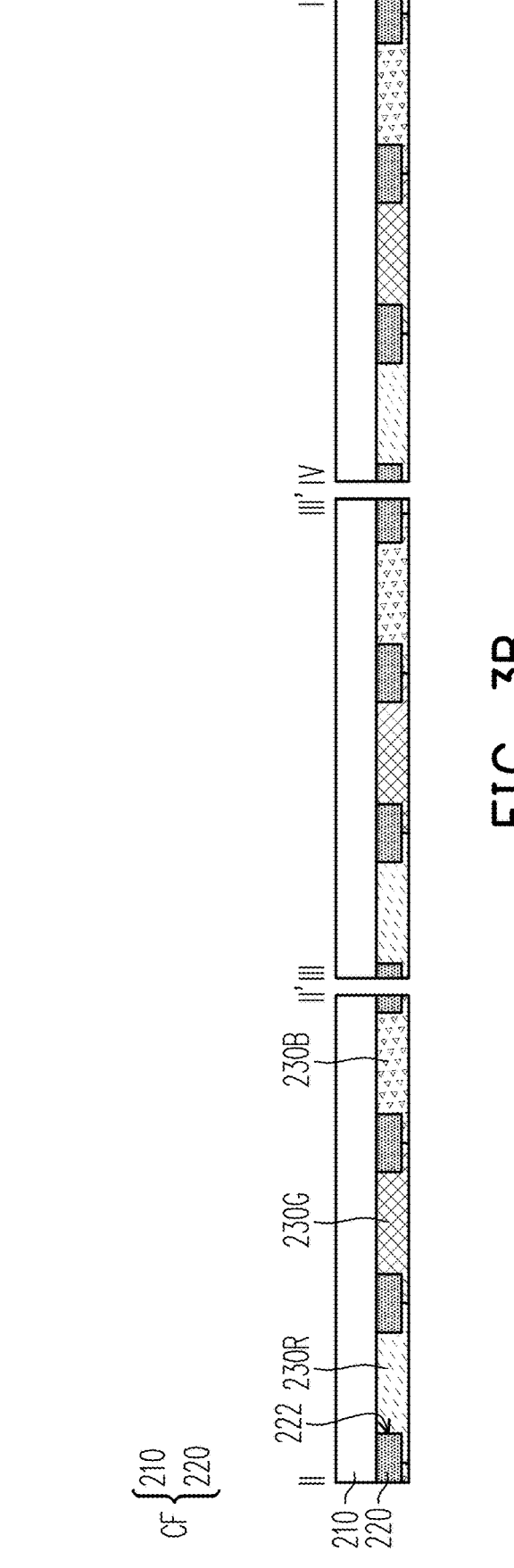

Please refer to FIG. 1B, FIG. 2B and FIG. 3B. Next, a color filter substrate CF is provided. The color filter substrate CF includes a light-transmitting base 210, a light-shielding pattern layer 220, and multiple color filter patterns 230R, 230G, and 230B. The light-shielding pattern layer 220 has multiple openings 222 that define multiple sub-pixel regions R11', G11', B11', R12', G12', B12', R13', G13', B13', R14', G14' B14', R15', G15', B15', R16', G16', B16', R21', G21', B21', R22', G22', B22', R23', G23', B23', R24', G24', B24', R25', G25', B25', R26', G26', B26', R31', G31', B31', R32', G32', B32', R33', G33', B33', R34', G34', B34', R35', G35', B35', R36', G36', B36' of the color filter substrate CF. The multiple sub-pixel regions R11', G11', B11', R12', G12', B12', R13', G13', B13', R14', G14', B14', R15', G15', B15', R16', G16', B16', R21', G21', B21', R22', G22', B22', R23', G23', B23', R24', G24', B24', R25', G25', B25', R26', G26', B26', R31', G31', B31', R32', G32', B32', R33', G33', B33', R34', G34', B34', R35', G35', B35', R36', G36', B36' of the color filter substrate CF are to respectively overlap the multiple sub-pixel regions R11, G11, B11, R12, G12, B12, R13, G13, B13, R14, G14, B14, R15, G15, B15, R16, G16, B16, R21, G21, B21, R22, G22, B22, R23, G23, B23, R24, G24, B24, R25, G25, B25, R26, G26, B26, R31, G31, B31, R32, G32, B32, R33, G33, B33, R34, G34, B34, R35, G35, B35, R36, G36, B36 of the driving backplane 110. The multiple color filter patterns 230R, 230G, 230B are disposed in the multiple openings 222 that define the multiple sub-pixel regions R11', G11', B11', R12', G12', B12', R13', G13', B13', R14', G14', B14', R15', G15', B15', R16', G16', B16', R21', G21', B21', R22', G22', B22', R23', G23', B23', R24', G24', B24', R25', G25', B25', R26', G26', B26', R31', G31', B31', R32', G32', B32', R33', G33', B33', R34', G34', B34', R35', G35', B35', R36', G36', B36'.

In an embodiment, the multiple sub-pixel regions R11', G11', B11', R12', G12', B12', R13', G13', B13', R14', G14', B14', R15', G15', B15', R16', G16', B16', R21', G21', B21', R22', G22', B22', R23', G23', B23', R24', G24', B24', R25', G25', B25', R26', G26', B26', R31', G31', B31', R32', G32', B32', R33', G33', B33', R34', G34', B34', R35', G35', B35', R36', G36', B36' of the color filter substrate CF include the multiple first sub-pixel regions R11', R12', R13', R14', R15', R16', R21', R22', R23', R24', R25', R26', R31', R32', R33', R34', R35', R36', the multiple second sub-pixel regions G11', G12', G13', G14', G15', G16', G21', G22', G23', G24', G25', G26', G31', G32', G33', G34', G35', G36', and the multiple third sub-pixel regions B11', B12', B13', B14', B15', B16', B21', B22', B23', B24', B25', B26', B31', B32', B33', B34', B35', B36'. The multiple color filter patterns 230R, 230G, and 230B include multiple first color filter patterns 230R, multiple second color filter patterns 230G, and multiple third color filter patterns 230B. The multiple first color filter patterns 230R, the multiple second color filter patterns 230G, and the multiple third color filter patterns 230B are respectively disposed in the multiple first sub-pixel regions R11', R12', R13', R14', R15', R16', R21', R22', R23', R24', R25', R26', R31', R32', R33', R34', R35', R36', the multiple second sub-pixel regions G11', G12', G13', G14', G15', G16', G21', G22', G23', G24', G25', G26', G31', G32', G33', G34', G35', G36'; and the multiple third sub-pixel regions B11', B12', B13', B14', B15', B16', B21', B22', B23', B24', B25', B26', B31', B32', B33', B34', B35', B36'. In an embodiment, the first color filter pattern 230R, the second color filter pattern 230G, and the third color filter pattern 230B are, for example, a red filter pattern, a green filter pattern, and a blue filter pattern respectively, but this disclosure is not limited thereto.

Figure 1C:
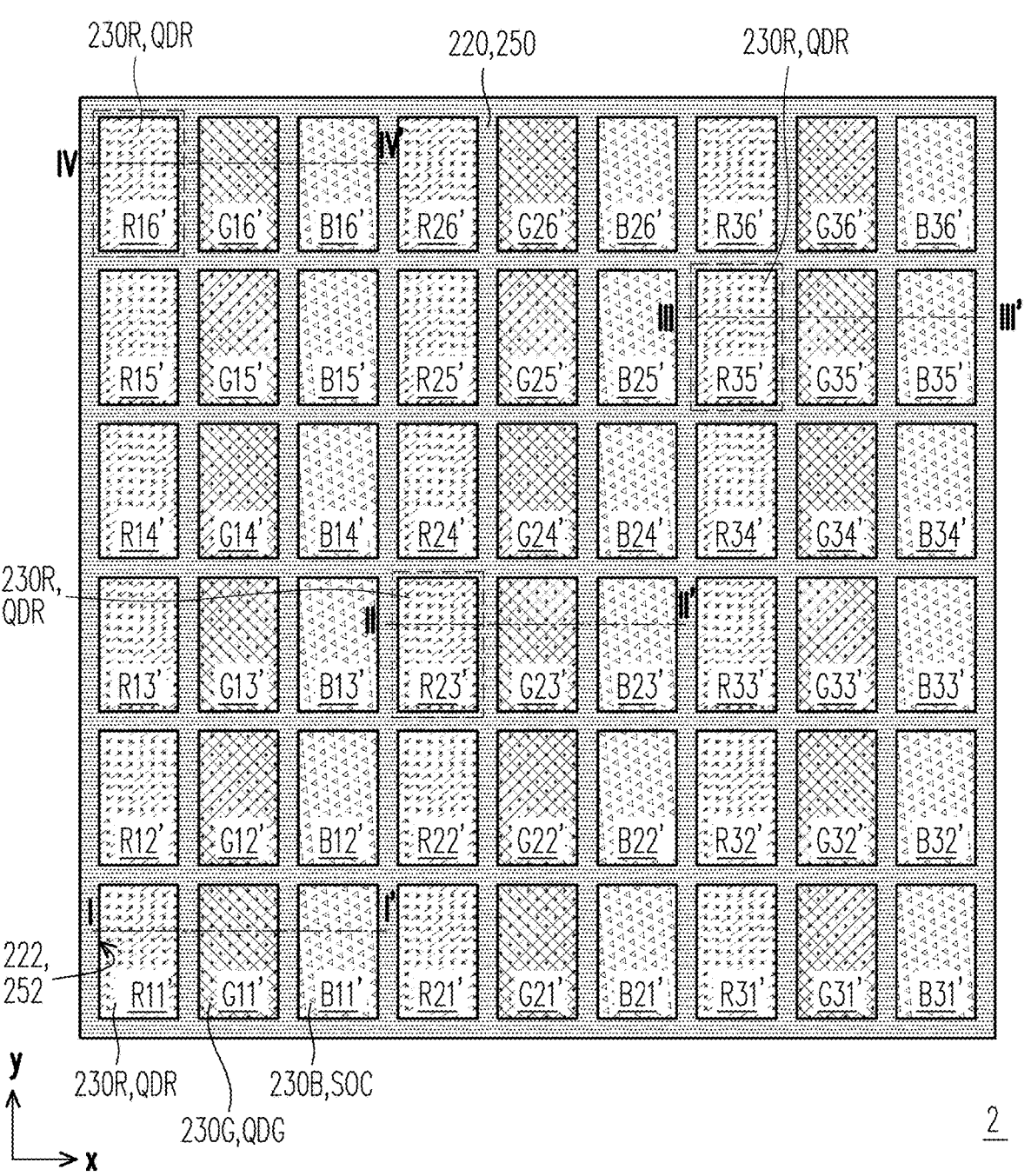
Figures 2C, 3C:
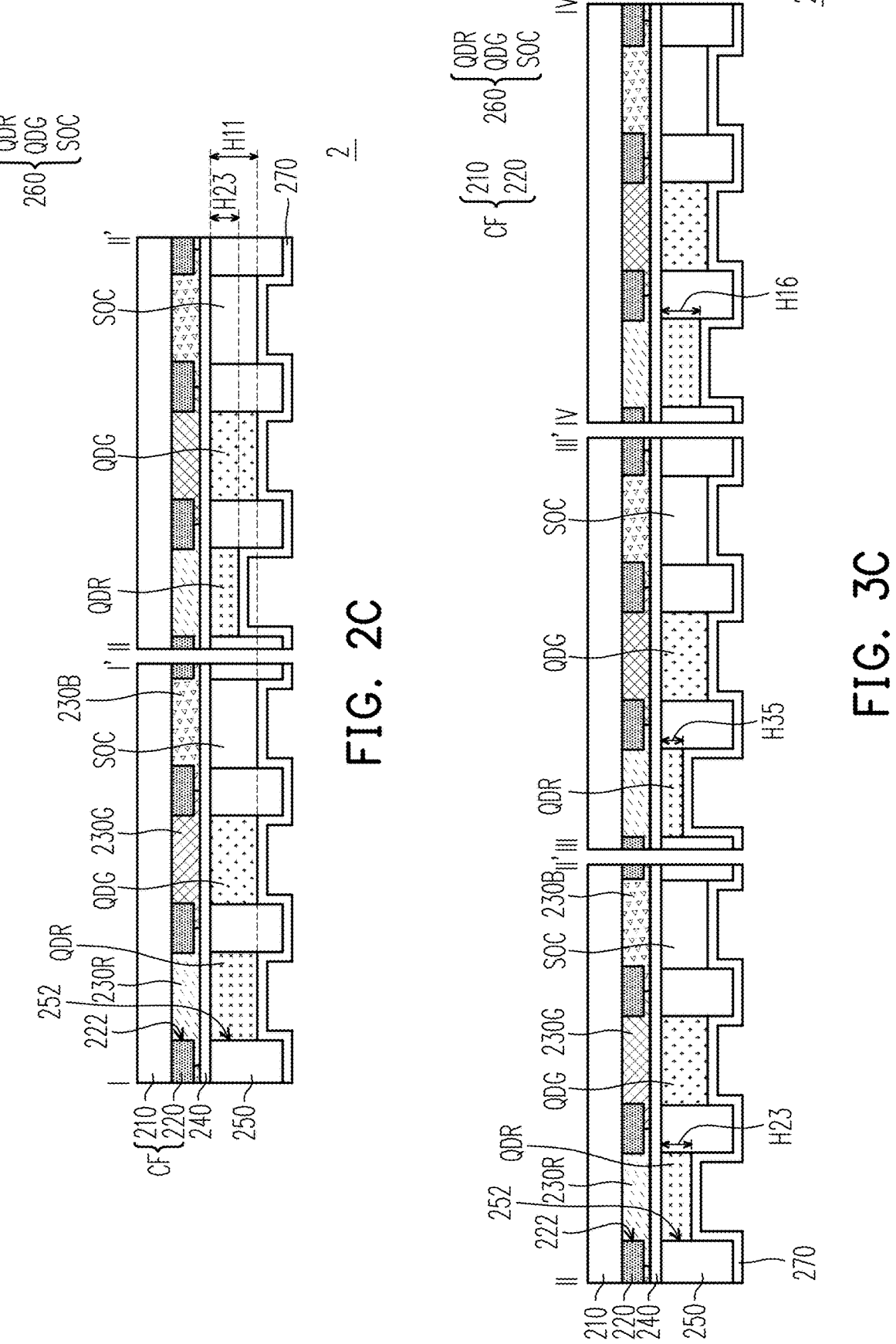

Please refer to FIG. 1C, FIG. 2C, and FIG. 3C. Next, a second barrier layer 240 is formed on the color filter substrate CF. In this embodiment, the second barrier layer 240 may be a light-transmitting inorganic material (such as silicon oxide, silicon nitride, silicon oxynitride, or a stacked layer of at least two of the above materials), a light-transmitting organic material, or a combination of the above, but the disclosure is not limited thereto.

Please refer to FIG. 1C, FIG. 2C and FIG. 3C. Next, a second bank layer 250 is formed on the second barrier layer 240. The second bank layer 250 has multiple openings 252. The multiple openings 252 of the second bank layer 250 respectively overlap the multiple openings 222 of the light-shielding pattern layer 220. In this embodiment, the material of the second bank layer 250 may absorb light, but the disclosure is not limited thereto.

Please refer to FIG. 1C, FIG. 2C, and FIG. 3C. Next, multiple light adjusting patterns 260 are formed in the multiple openings 252 of the second bank layer 250. In an embodiment, the light adjusting pattern 260 may include a first color conversion pattern QDR, a second color conversion pattern QDG, and a light transmission scattering pattern SOC, wherein the first color conversion pattern QDR, the second color conversion pattern QDG, and the light transmission scattering pattern SOC respectively overlap the first color filter pattern 230R, the second color filter pattern 230G, and the third color filter pattern 230B. In an embodiment, the first color conversion pattern QDR is used to receive blue light and convert it into red light, the second color conversion pattern QDG is used to receive blue light and convert it into green light, and the light transmission scattering pattern SOC may allow the blue light to pass through and scatter, but the disclosure is not limited thereto. For example, in an embodiment, an ink-jet printing (IJP) process may be used to form the light adjusting pattern 260, but the disclosure is not limited thereto.

It is worth noting that thicknesses H11, H23, H35, H16 of the first color conversion pattern QDR are adjusted accordingly based on the classification of the multiple light-emitting elements 130.

Please refer to FIG. 1A, FIG. 2A, FIG. 3A, FIG. 1C, FIG. 2C, and FIG. 3C. For example, in an embodiment, the center wavelength of the light beam emitted by the light-emitting element 130 located in the first sub-pixel region R11 of the pixel region PX11 in the first column and the first row falls in a normal value (e.g. 455 nm) and is classified as the normal type, and the thickness H11 of the first color conversion pattern QDR used to overlap the light-emitting element 130 of the normal type has a normal original setting value (e.g. 10 μm). The center wavelength of the light beam emitted by the light-emitting element 130 located in the first sub-pixel region R23 of the pixel region PX23 in the second column and the third row falls in the first abnormal value (e.g. 452 nm) and is classified as the first abnormal type, and the thickness H23 of the first color conversion pattern QDR used to overlap the light-emitting element 130 of the first abnormal type is adjusted to a first compensation value (e.g. 8 μm). The center wavelength of the light beam emitted by the light-emitting element 130 of the first sub-pixel region R35 of the pixel region PX35 located in the third column and the fifth row falls in the second abnormal value (e.g. 450 nm) and is classified as the second abnormal type, and the thickness H35 of the first color conversion pattern QDR used to overlap the light-emitting element 130 of the second abnormal type is adjusted to a second compensation value (e.g. 7 μm). The center wavelength of the light beam emitted by the light-emitting element 130 in the first sub-pixel region R16 of the pixel region PX16 located in the first column and the sixth row falls in the third abnormal value (e.g. 454 nm) and is classified as the third abnormal type, and the thickness H16 of the first color conversion pattern QDR used to overlap the light-emitting element 130 of the third abnormal type is adjusted to a third compensation value (e.g. 9 μm).

In an embodiment, the center wavelength of the light beam emitted by the light-emitting element 130 of the first abnormal type (e.g. the light-emitting element 130 located in the first sub-pixel region R23) is smaller than the center wavelength of the light beam emitted by the light-emitting element 130 of the normal type (e.g. the light-emitting element 130 located in the first sub-pixel region R11), and the thickness H23 of the first color conversion pattern QDR used to overlap the light-emitting element 130 of the first abnormal type is smaller than the thickness H11 of the first color conversion pattern QDR used to overlap the light-emitting element 130 of the normal type.

In an embodiment, the center wavelength of the light beam emitted by the light-emitting element 130 of the second abnormal type (e.g. the light-emitting element 130 located in the first sub-pixel region R35) is smaller than the center wavelength of the light beam emitted by the light-emitting element 130 of the first abnormal type (e.g. the light-emitting element 130 located in the first sub-pixel region R23), and the thickness H35 of the first color conversion pattern QDR used to overlap the light-emitting element 130 of the second abnormal type is smaller than the thickness H23 of the first color conversion pattern QDR used to overlap the light-emitting element 130 of the first abnormal type.

In an embodiment, the center wavelength of the light beam emitted by the light-emitting element 130 of the third abnormal type (e.g. the light-emitting element 130 located in the first sub-pixel region R16) is between the center wavelength of the light beam emitted by the light-emitting element 130 of the first abnormal type (e.g. the light-emitting element 130 located in the first sub-pixel region R23) and the center wavelength of the light beam emitted by the light-emitting element 130 of the normal type (e.g. the light-emitting element 130 located in the first sub-pixel region R11), and the thickness H16 of the first color conversion pattern QDR used to overlap the light-emitting element 130 of the third abnormal type is between the thickness H23 of the first color conversion pattern QDR used to overlap the light-emitting element 130 of the first abnormal type and the thickness H11 of the first color conversion pattern QDR used to overlap the light-emitting element 130 of the normal type.

In brief, in an embodiment, the center wavelength of the light beam emitted by the light-emitting element 130 of the normal type>the center wavelength of the light beam emitted by the light-emitting element 130 of the third abnormal type>the center wavelength of the light beam emitted by the light-emitting element 130 of the first abnormal type>the center wavelength of the light beam emitted by the light-emitting element 130 of the second abnormal type. The thickness H11 of the first color conversion pattern QDR used to overlap the light-emitting element 130 of the normal type>the thickness H16 of the first color conversion pattern QDR used to overlap the light-emitting element 130 of the third abnormal type>the thickness H23 of the first color conversion pattern QDR used to overlap the light-emitting element 130 of the first abnormal type>the thickness H35 of the first color conversion pattern QDR used to overlap the light-emitting element 130 of the second abnormal type.

Referring to FIG. 1C, FIG. 2C and FIG. 3C. Next, a first barrier layer 270 is formed on the second bank layer 250 and the multiple light adjusting patterns 260. At this point, an upper substrate 2 is completed. In this embodiment, the first barrier layer 270 may be a light-transmitting inorganic material (such as silicon oxide, silicon nitride, silicon oxynitride, or a stacked layer of at least two of the above materials), a light-transmitting organic material, or a combination of the above, but the disclosure is not limited thereto.

Figure 1D:
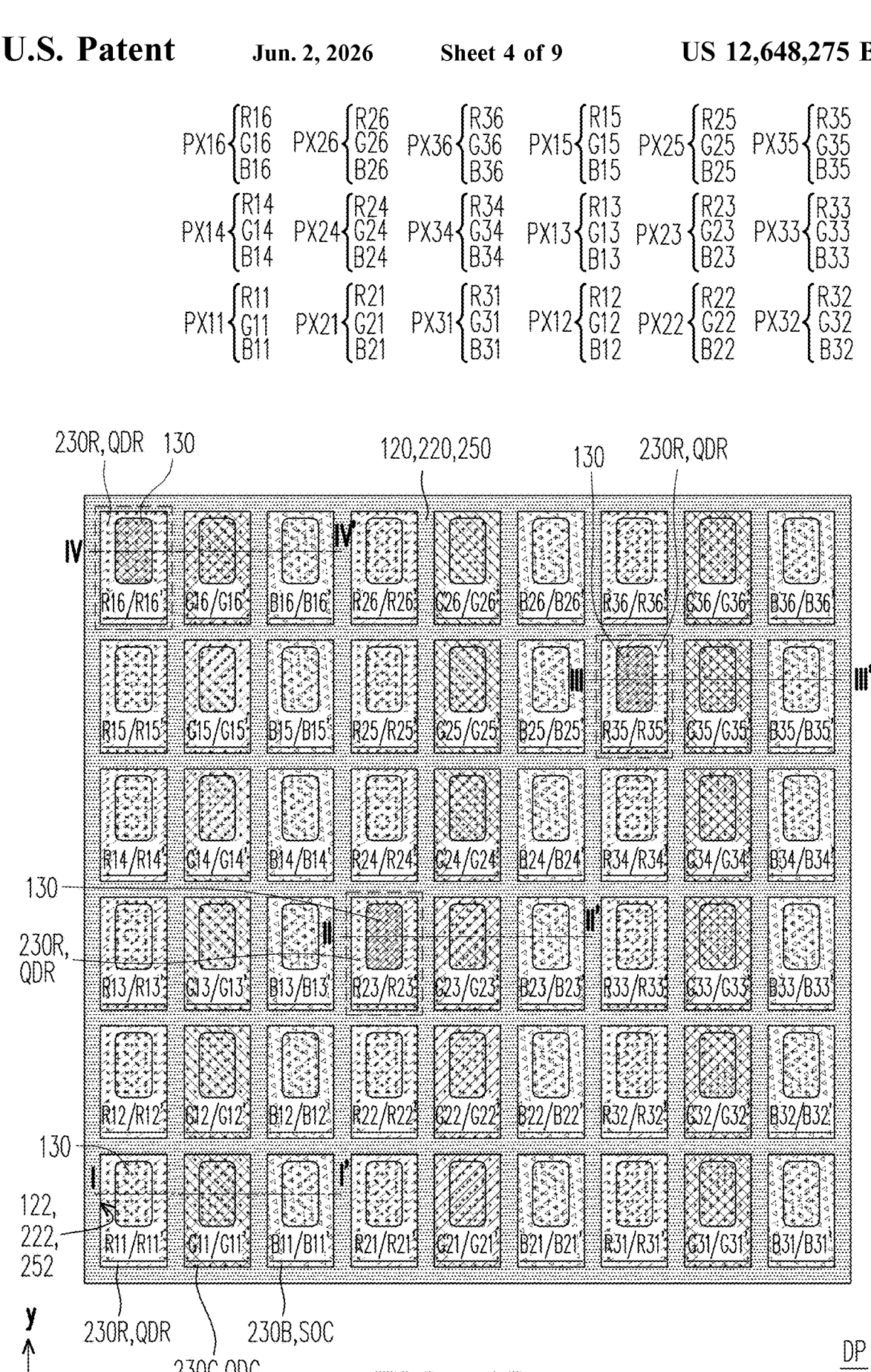
Figures 2D, 3D:
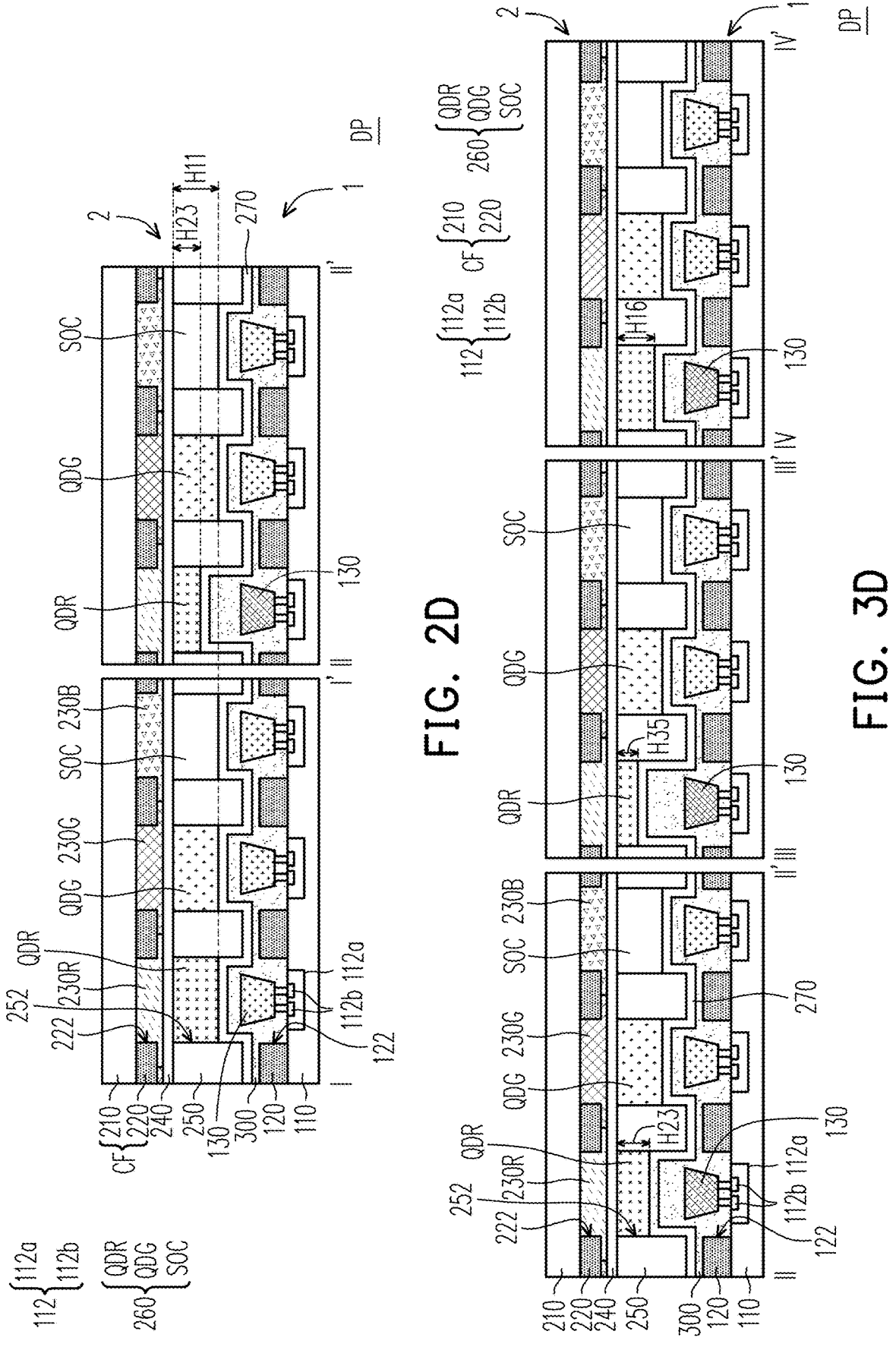

Please refer to FIG. 1D, FIG. 2D, and FIG. 3D. Next, the upper substrate 2 and the bottom substrate 1 are assembled such that the upper substrate 2 and the bottom substrate 1 are firmly connected, and the multiple sub-pixel regions R11', G11', B11', R12', G12', B12', R13', G13', B13', R14', G14', B14', R15', G15', B15', R16', G16', B16', R21', G21', B21', R22', G22', B22', R23', G23', B23', R24', G24', B24', R25', G25', B25', R26', G26', B26', R31', G31', B31', R32', G32', B32', R33', G33', B33', R34', G34', B34', R35', G35', B35', R36', G36', B36' of the upper substrate 2 respectively overlap the multiple sub-pixel regions R11, G11, B11, R12, G12, B12, R13, G13, B13, R14, G14, B14, R15, G15, B15, R16, G16, B16, R21, G21, B21, R22, G22, B22, R23, G23, B23, R24, G24, B24, R25, G25, B25, R26, G26, B26, R31, G31, B31, R32, G32, B32, R33, G33, B33, R34, G34, B34, R35, G35, B35, R36, G36, B36 of the bottom substrate 1. At this point, a display apparatus DP of this embodiment is completed. In an embodiment, the upper substrate 2 and the bottom substrate 1 may be fixed to each other using a connection layer 300 disposed between the two. In an embodiment, the connection layer 300 may be a filler or a dam, but the disclosure is not limited thereto.

Moreover, it should be noted that the above manufacturing process of the display apparatus DP is based on a double-substrate process (that is, the light-emitting element 130 and the light adjusting pattern 260 are respectively formed on different substrates and then assembled). However, the disclosure is not limited thereto. In other embodiments, the display apparatus DP may also be manufactured using a single-substrate process. That is, the light-emitting element 130 and the light adjusting pattern 260 are sequentially formed on the same substrate.

Please refer to FIG. 1D, FIG. 2D, and FIG. 3D. The display apparatus DP includes the driving backplane 110, the first bank layer 120, the multiple light-emitting elements 130, the first barrier layer 270, the second bank layer 250, the multiple light adjusting patterns 260, the second barrier layer 240, the light-shielding pattern layer 220, and the multiple color filter patterns 230R, 230G, 230B.

The driving backplane 110 has the multiple sub-pixel driving structures 112. The first bank layer 120 is disposed on the driving backplane 110 and has the multiple openings 122. The multiple light-emitting elements 130 are disposed on the driving backplane 110, located in the multiple openings 122 of the first bank layer 120, and are electrically connected to the multiple sub-pixel driving structures 112.

The first barrier layer 270 is disposed on the multiple light-emitting elements 130. The second bank layer 250 is disposed on the first bank layer 120 and has the multiple openings 252. The multiple openings 252 of the second bank layer 250 respectively overlap the multiple openings 122 of the first bank layer 120. In an embodiment, the first barrier layer 270 is disposed on the first bank layer 120 and the multiple light-emitting elements 130, and the second bank layer 250 may be disposed on the first barrier layer 270.

The multiple light adjusting patterns 260 are respectively disposed in the multiple openings 252 of the second bank layer 250. The second barrier layer 240 is disposed on the multiple light adjusting patterns 260. The light-shielding pattern layer 220 is disposed on the second bank layer 250 and has the multiple openings 222. The multiple openings 222 of the light-shielding pattern layer 220 respectively overlap the multiple openings 252 of the second bank layer 250. In an embodiment, the second barrier layer 240 is disposed on the multiple light adjusting patterns 260 and the second bank layer 250, and the light-shielding pattern layer 220 is disposed on the second barrier layer 240. The multiple color filter patterns 230R, 230G, and 230B are disposed in the multiple openings 222 of the light-shielding pattern layer 220.

It is worth noting that the multiple color filter patterns 230R, 230G, and 230B include the multiple first color filter patterns 230R having the same color. The multiple light-emitting elements 130 include multiple first light-emitting elements respectively overlapping the multiple first color filter patterns 230R (e.g. the two light-emitting elements 130 respectively located in the sub-pixel region R11 and the sub-pixel region R23). The multiple light adjusting patterns 260 include the multiple first color conversion patterns QDR respectively overlapping the multiple first color filter patterns 230R (e.g. the two first color conversion patterns QDR respectively located in the sub-pixel region R11 and the sub-pixel region R23). One of multiple first light-emitting elements (e.g. the light-emitting element 130 located in the sub-pixel region R11) and one of multiple first color conversion patterns QDR (e.g. the first color conversion pattern QDR located in the sub-pixel region R11) overlap one of the multiple first color filter patterns 230R (e.g. the first color filter pattern 230R located in the sub-pixel region R11). Another one of the multiple first light-emitting elements 130 (e.g. the light-emitting element 130 located in the sub-pixel region R23) and another one of the multiple first color conversion patterns QDR (e.g. the first color conversion pattern QDR located in the sub-pixel region R23) overlap another one of the multiple first color filter patterns 230R (e.g. the first color filter pattern 230R located in the sub-pixel region R11). In particular, the center wavelength of the one of the multiple first light-emitting elements (e.g. the light-emitting element 130 located in the sub-pixel region R11) is greater than the center wavelength of the another one of the multiple first light-emitting elements (e.g. the light-emitting element 130 located in the sub-pixel region R23), and the thickness of the one of the multiple first color conversion patterns QDR (e.g. the thickness H11 of the first color conversion pattern QDR located in the sub-pixel region R11) is greater than the thickness of the another one of the multiple first color conversion patterns QDR (e.g. the thickness H23 of the first color conversion pattern QDR located in the sub-pixel region R23).

In an embodiment, there is a thickness difference between the thickness of one of the pattern QDR located in the sub-pixel region R11) and the thickness of another one of the multiple first color conversion patterns QDR (e.g. the thickness H23 of the first color conversion pattern QDR located in the sub-pixel region R23), and a ratio of the thickness difference to the thickness of one of the multiple first color conversion patterns QDR (e.g. the thickness H11 of the first color conversion pattern QDR located in the sub-pixel region R11) falls in a range of 30% to 80%.

In an embodiment, a difference between the center wavelength of one of the multiple first light-emitting elements (e.g. the light-emitting element 130 located in the sub-pixel region R11) and the center wavelength of another one of the multiple first light-emitting elements (e.g. the light-emitting element 130 located in the sub-pixel region R23) falls in a range of 4 μm to 10 μm.

In an embodiment, yet another one of the multiple first light-emitting elements (e.g. the light-emitting element 130 located in the sub-pixel region R35) and yet another one of the multiple first color conversion patterns QDR (e.g. the first color conversion pattern QDR located in the sub-pixel region R35) overlap yet another one of the multiple first color filter patterns 230R (e.g. the first color filter pattern 230R located in the sub-pixel region R35). The center wavelength of another one of the multiple first light-emitting elements (e.g. the light-emitting element 130 located in the sub-pixel region R23) is between the center wavelength of yet another one of the multiple first light-emitting elements (e.g. the light-emitting element 130 located in the sub-pixel region R35) and the center wavelength of one of the multiple first light-emitting elements (e.g. the light-emitting element 130 located in the sub-pixel region R11). Also, the thickness of another one of the multiple first color conversion patterns QDR (e.g. the thickness H23 of the first color conversion pattern QDR located in the sub-pixel region R23) is between the thickness of yet another one of the multiple first color conversion patterns QDR (e.g. the thickness H35 of the first color conversion pattern QDR located in the sub-pixel region R35) and the thickness of one of the pattern QDR located in the sub-pixel region R11).

In an embodiment, still another one of the multiple first light-emitting elements (e.g. the light-emitting element 130 located in the sub-pixel region R16) and still another one of the multiple first color conversion patterns QDR (e.g. the first color conversion pattern QDR located in the sub-pixel region R16) overlap still another one of the multiple first color filter patterns 230R (e.g. the first color filter pattern 230R located in the sub-pixel region R16). The center wavelength of still another one of the multiple first light-emitting elements (e.g. the light-emitting element 130 located in the sub-pixel region R16) is between the center wavelength of another one of the multiple first light-emitting elements (e.g. the light-emitting element 130 located in the sub-pixel region R23) and the center wavelength of one of the multiple first light-emitting elements (e.g. the light-emitting element 130 located in the sub-pixel region R11). Also, the thickness of still another one of the multiple first color conversion patterns QDR (e.g. the thickness H16 of the first color conversion pattern QDR located in the sub-pixel region R16) is between the thickness of another one of the multiple first color conversion patterns QDR (e.g. the thickness H23 of the first color conversion pattern QDR located in the sub-pixel region R23) and the thickness of one of the multiple first color conversion patterns QDR (e.g. the thickness H11 of the first color conversion pattern QDR located in the sub-pixel region R11).

For example, in an embodiment, the center wavelength of one of the multiple first light-emitting elements (e.g. the light-emitting element 130 located in the sub-pixel region R11) is substantially 455 nm, and the thickness of one of the multiple first color conversion patterns QDR (e.g. the thickness H11 of the first color conversion pattern QDR located in the sub-pixel region R11) is substantially 10 μm. The center wavelength of another one of the multiple first light-emitting elements (e.g. the light-emitting element 130 located in the sub-pixel region R23) is substantially 452 nm, and the thickness of another one of the multiple first color conversion patterns QDR (e.g. the thickness H23 of the first color conversion pattern QDR located in the sub-pixel region R23) is substantially 8 μm. The center wavelength of yet another one of the multiple first light-emitting elements (e.g. the light-emitting element 130 located in the sub-pixel region R35) is substantially 450 nm, and the thickness of yet another one of the multiple first color conversion patterns QDR (e.g. the thickness H35 of the first color conversion pattern QDR located in the sub-pixel region R35) is substantially 7 μm. The center wavelength of still another one of the multiple first light-emitting elements (e.g. the light-emitting element 130 located in the sub-pixel region R16) is substantially 454 nm, and the thickness of still another one of the multiple first color conversion patterns QDR (e.g. the thickness H16 of the first color conversion pattern QDR located in the sub-pixel region R16) is substantially 9 μm.

Table 1 lists the center wavelengths of the light-emitting elements 130 located in each of the sub-pixel regions R11, R23, R35, R16; wavelength-related conversion factors of the multiple light-emitting elements 130 located in each of the sub-pixel regions R11, R23, R35, R16; and the thicknesses H11, H23, H35, H16 of the first color conversion patterns QDR located in each of the sub-pixel regions R11, R23, R35, R16.

The brightness of the blue light emitted by the light-emitting elements 130 in each of the sub-pixel regions R11, R23, R35, R16 is B. The brightness of the red light converted from the blue light emitted by the light-emitting elements 130 in each of the sub-pixel regions R11, R23, R35, R16 after passing through the same first color conversion pattern QDR is R. A wavelength-related conversion factor R/B shown in Table 1 refers to: the ratio of a brightness R of the red light converted from the blue light emitted by the light-emitting elements 130 in each of the sub-pixel regions R11, R23, R35, R16 after passing through the same first color conversion pattern QDR to a brightness B of the blue light emitted by the light-emitting elements 130 in each of the sub-pixel regions R11, R23, R35, R16.

TABLE 1

| | Center wavelength of light-emitting element 130 | Wavelength-related conversion factor R/B | The thickness of first color conversion pattern QDR |
|---|---|---|---|
| Sub-pixel region R11 | 455 nm | 100% | 10 μm |
| Sub-pixel region R23 | 452 nm | 114% | 8 μm |
| Sub-pixel region R35 | 450 nm | 140% | 7 μm |
| Sub-pixel region R16 | 454 nm | 105% | 9 μm |

It may be seen from Table 1 that the shorter the center wavelength of the light-emitting element 130, the higher the wavelength-related conversion factor R/B. That is, for the same first color conversion pattern QDR having a fixed thickness, the shorter the wavelength of the received blue light, the higher the brightness of the converted red light.

Figure 4:
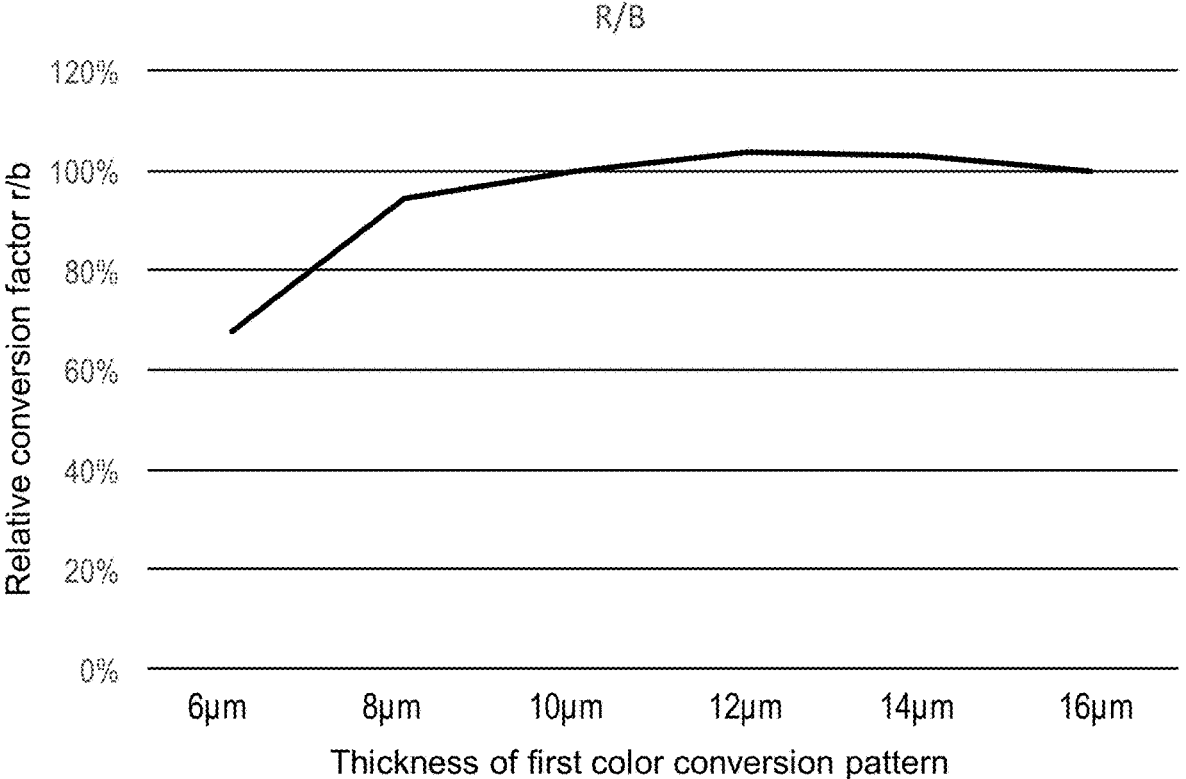
FIG. 4 shows the relationship between the thickness of a first color conversion pattern and a relative conversion factor.

FIG. 4 shows the relationship between the thickness of the first color conversion pattern QDR and a relative conversion factor r/b. The light-emitting element may emit blue light having a fixed wavelength distribution (e.g. blue light having a center wavelength of 450 nm). The blue light is converted into red light through the first color conversion pattern QDR of a certain fixed thickness. A ratio of the brightness of the red light to the brightness of the blue light may be referred to as an absolute conversion factor. The absolute conversion factor of the first color conversion pattern QDR having a thickness of 10 μm is used as a reference. That is, the absolute conversion factor of the first color conversion pattern QDR having a thickness of 10 μm is regarded as a 100% relative conversion factor, and the relative conversion factor r/b of the first color conversion pattern QDR of other thicknesses is a ratio of the absolute conversion factor of the first color conversion pattern QDR of other thicknesses to the absolute conversion factor of the first color conversion pattern QDR having a thickness of 10 μm. It may be seen from FIG. 4 that within a certain thickness (e.g. within 10 μm), the thicker the thickness of the first color conversion pattern QDR, the greater the relative conversion factor r/b of the first color conversion pattern QDR. That is, within a certain thickness (e.g. within 10 μm), the thicker the first color conversion pattern QDR, the higher the brightness of the red light may be converted.

The center wavelength of the light-emitting element 130 located in the sub-pixel region R11 is greater than the center wavelength of the light-emitting element 130 located in the sub-pixel region R23. When passing through the first color conversion pattern QDR passing of the same thickness, the brightness of the red light converted from the blue light emitted by the light-emitting element 130 located in the sub-pixel region R11 is converted by the first color conversion pattern QDR is lower, and the brightness of the red light converted from the blue light emitted by the light-emitting element 130 located in the sub-pixel region R23 is converted by the first color conversion pattern QDR is higher. However, the thickness H11 of the first color conversion pattern QDR located in the sub-pixel region R11 is greater than the thickness H23 of the first color conversion pattern QDR located in the sub-pixel region R23. The first color conversion pattern QDR having different thicknesses H11 and H23 may compensate for the difference in the wavelength-related conversion factor R/B caused by the center wavelength shift of the multiple light-emitting elements 130 respectively located in the sub-pixel regions R11 and R23, thereby making the brightness in each of the sub-pixel regions R11 and R23 consistent, and improving the optical performance of the display apparatus DP.

It will be apparent to those skilled in the art that various modifications and variations may be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A display apparatus, comprising:
   a driving backplane, comprising a plurality of sub-pixel driving structures;

a first bank layer, disposed on the driving backplane and having a plurality of openings;

a plurality of light-emitting elements, disposed on the driving backplane, located in the openings of the first bank layer, and are electrically connected to the sub-pixel driving structures;

a first barrier layer, disposed on the light-emitting elements;

a second bank layer, disposed on the first bank layer and having a plurality of openings, wherein the openings of the second bank layer respectively overlap the openings of the first bank layer;

a plurality of light adjusting patterns, respectively disposed in the openings of the second bank layer;

a second barrier layer, disposed on the light adjusting patterns;

a light-shielding pattern layer, disposed on the second bank layer and having a plurality of openings, wherein the openings of the light-shielding pattern layer respectively overlap the openings of the second bank layer; and a plurality of color filter patterns, disposed in the openings of the light-shielding pattern layer, wherein the color filter patterns comprise a plurality of first color filter patterns having a same color, the light-emitting elements comprise a plurality of first light-emitting elements respectively overlapping the first color filter patterns, the light adjusting patterns comprise a plurality of first color conversion patterns respectively overlapping the first color filter patterns, one of the first light-emitting elements and one of the first color conversion patterns overlap one of the first color filter patterns, another one of the first light-emitting elements and another one of the first color conversion patterns overlap another one of the first color filter patterns, a center wavelength of the one of the first light-emitting elements is greater than a center wavelength of the another one of the first light-emitting elements, and a thickness of the one of the first color conversion patterns is greater than a thickness of the another one of the first color conversion patterns.

2. The display apparatus according to claim 1, wherein there is a thickness difference between the thickness of the one of the first color conversion patterns and the thickness of the another one of the first color conversion patterns, and a ratio of the thickness difference to the thickness of the one of the first color conversion patterns falls in a range of 30% to 80%.

3. The display apparatus according to claim 1, wherein a difference between the center wavelength of the one of the first light-emitting elements and the center wavelength of the another one of the first light-emitting elements falls in a range of 4 μm to 10 μm.

4. The display apparatus according to claim 1, wherein the center wavelength of the one of the first light-emitting elements is substantially 455 nm, the thickness of the one of the first color conversion pattern is substantially 10 μm, the center wavelength of the another one of the first light-emitting elements is substantially 452 nm, and the thickness of the another one of the first color conversion patterns is substantially 8 μm.

5. The display apparatus according to claim 1, wherein yet another one of the first light-emitting elements and yet another one of the first color conversion patterns overlap yet another one of the first color filter patterns, the center wavelength of the another one of the first light-emitting elements is between a center wavelength of the yet another one of the first light-emitting elements and the center wavelength of the one of the first light-emitting elements, and the thickness of the another one of the first color conversion patterns is between a thickness of the yet another one of the first color conversion patterns and the thickness of the one of the first color conversion patterns.

6. The display apparatus according to claim 5, wherein the center wavelength of the one of the first light-emitting elements is substantially 455 nm, the thickness of the one of the first color conversion patterns is substantially 10 μm, the center wavelength of the another one of the first light-emitting elements is substantially 452 nm, the thickness of the another one of the first color conversion patterns is substantially 8 μm, the center wavelength of the yet another one of the first light-emitting elements is substantially 450 nm, and the thickness of the yet another one of the first color conversion patterns is substantially 7 μm.

7. The display apparatus according to claim 5, wherein still another one of the first light-emitting elements and still another one of the first color conversion patterns overlap still another one of the first color filter patterns, a center wavelength of the still another one of the first light-emitting elements is between the center wavelength of the another one of the first light-emitting elements and the center wavelength of the one of the first light-emitting elements, and a thickness of the still another one of the first color conversion patterns is between the thickness of the another one of the first color conversion patterns and the thickness of the one of the first color conversion patterns.

8. The display apparatus according to claim 7, wherein the center wavelength of the one of the first light-emitting elements is substantially 455 nm, the thickness of the one of the first color conversion patterns is substantially 10 μm, the center wavelength of the another one of the first light-emitting elements is substantially 452 nm, the thickness of the another one of the first color conversion patterns is substantially 8 μm, the center wavelength of the yet another one of the first light-emitting elements is substantially 450 nm, the thickness of the yet another one of the first color conversion patterns is substantially 7 μm, the center wavelength of the still another one of the first light-emitting elements is substantially 454 nm, and the thickness of the still another one of the first color conversion patterns is substantially 9 μm.

\* \* \* \* \*